United States Patent
Zangi et al.

(10) Patent No.: US 9,768,775 B2
(45) Date of Patent: Sep. 19, 2017

(54) METHODS AND APPARATUSES FOR SUB-THRESHOLD CLOCK TREE DESIGN FOR OPTIMAL POWER

(71) Applicants: Uzi Zangi, Hod-Hasharon (IL); Neil Feldman, Misgav (IL)

(72) Inventors: Uzi Zangi, Hod-Hasharon (IL); Neil Feldman, Misgav (IL)

(73) Assignee: PLSense Ltd., Hod-Hasharon (IL)

( * ) Notice: Subject to any disclaimer, the term of this patent is extended or adjusted under 35 U.S.C. 154(b) by 11 days.

(21) Appl. No.: 14/923,743

(22) Filed: Oct. 27, 2015

(65) Prior Publication Data

US 2016/0126954 A1    May 5, 2016

Related U.S. Application Data

(60) Provisional application No. 62/072,500, filed on Oct. 30, 2014.

(51) Int. Cl.
*H03K 19/177* (2006.01)
*H03K 19/00* (2006.01)

(52) U.S. Cl.
CPC ... *H03K 19/0016* (2013.01); *H03K 19/17788* (2013.01); *H03K 19/17796* (2013.01)

(58) Field of Classification Search
None
See application file for complete search history.

(56) References Cited

U.S. PATENT DOCUMENTS

| | | | | |
|---|---|---|---|---|
| 7,477,073 B1* | 1/2009 | Tuan | ............... | H03K 19/17736 326/101 |
| 2008/0129362 A1* | 6/2008 | Kawai | ............... | G06F 17/5031 327/292 |
| 2013/0154686 A1* | 6/2013 | Chan | ............... | H03K 19/017581 326/40 |
| 2013/0159757 A1* | 6/2013 | Park | ............... | G11C 15/00 713/400 |
| 2013/0214816 A1* | 8/2013 | Thornton | ............... | G06F 1/10 326/93 |
| 2014/0266369 A1* | 9/2014 | Brunolli | ............... | H03K 3/0375 327/211 |
| 2015/0188519 A1* | 7/2015 | Singhal | ............... | H03K 3/0375 327/199 |

* cited by examiner

*Primary Examiner* — Douglas W Owens
*Assistant Examiner* — James H Cho

(57) ABSTRACT

A method and flow for implementing a "clock tree" inside an ASIC using Sub-threshold or Near-threshold technology with optimal power. The invention may also implement concurrently use of two voltage domains inside a single place and route block. One voltage domain for the "clock tree" buffers and one voltage domain for the other cells at the block. The voltage domain for the "clock tree" buffers that is used is slightly higher than the voltage domain which is used for the other cells. The higher voltage ensures a large reduction of the total number of buffers inside the "clock tree" and the dynamic and static power are reduced dramatically despite the use of slightly higher operating voltage.

20 Claims, 2 Drawing Sheets

"Clock tree" structure driving FF's with two different voltage domain - 100

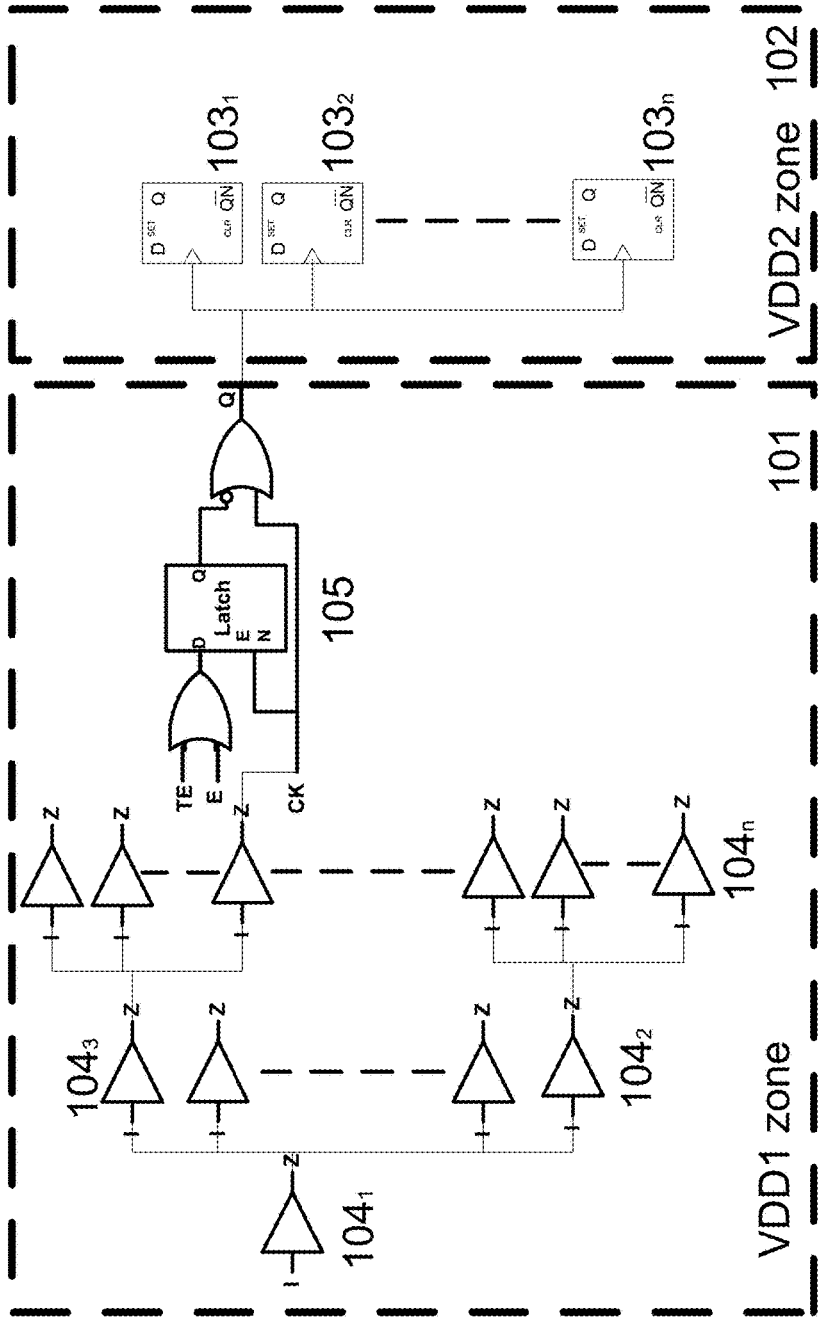
Figure 1 – "Clock tree" structure driving FF's with two different voltage domain - 100

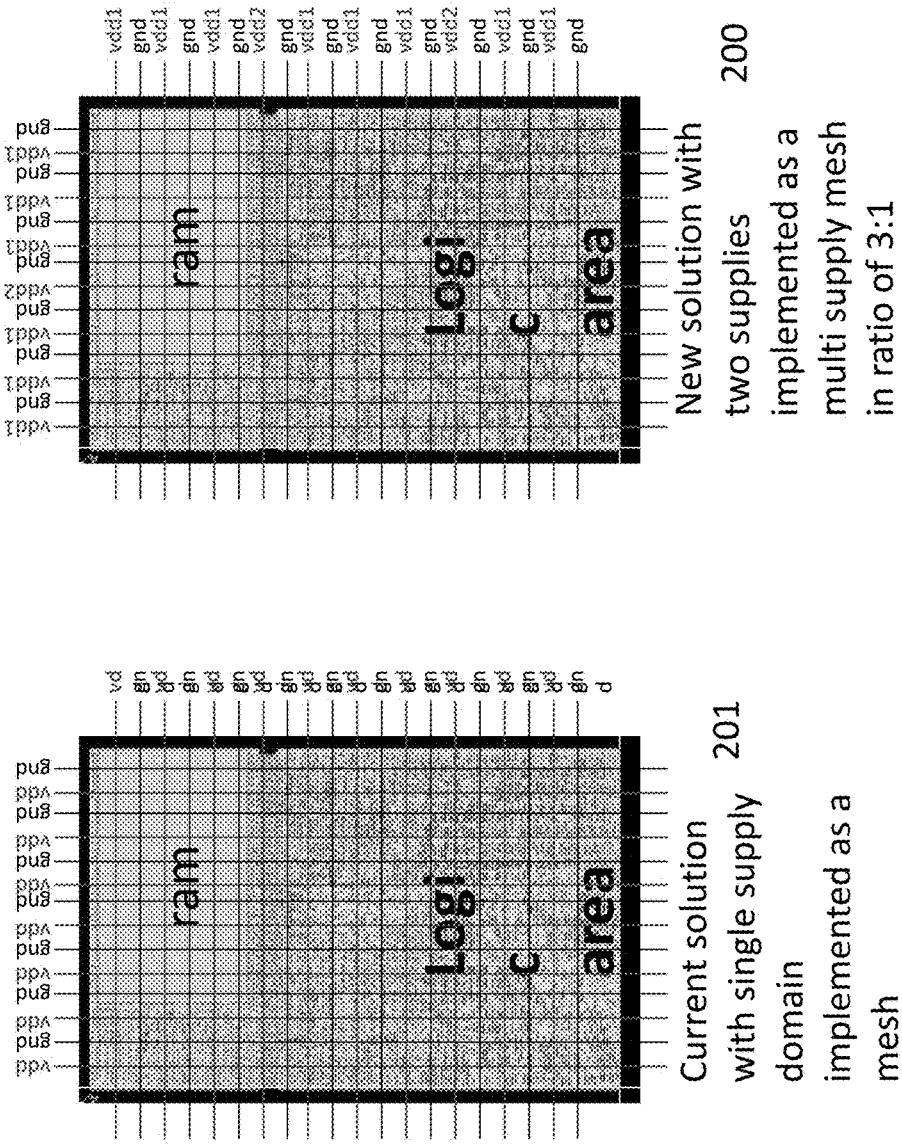
Figure 2 – P&R structure using two different voltage domain

METHODS AND APPARATUSES FOR SUB-THREHOLD CLOCK TREE DESIGN FOR OPTIMAL POWER

FIELD

This invention relates generally to the field of silicon design flow, and more specifically to a Near-threshold or Sub-threshold implementation of ultra-low power design flow and more specifically to a method and flow for implementing a "clock tree" inside an ASIC using Sub-threshold or Near-threshold technology with optimal power.

BACKGROUND

Many new emerging applications require the use of ultra-low power consumption solutions inside a chip. This will allow them to be incorporated into devices that operate from a small non-chargeable battery for very long periods without the need to frequently charge the battery. For example, wearable devices, mobile devices and IoT (Internet of Things) devices may require an ultra-low power design flow.

Sub-threshold technology is a way of operating the CMOS transistors using an operating voltage which is below their threshold voltage (known as VT), which is the point where the transistor moves from the weak inversion state, where the transistors are never fully turned on, to the strong inversion state where the transistor are fully turn on. When operating in the sub-threshold region, the transistor state varies between being fully turned off and partially turned on.

Near-threshold technology is the way of operating the CMOS transistor using an operating voltage which is a slightly above the threshold point where the transistor moves to the strong inversion state but still working slower than using high voltages which are above this point.

Near-threshold and Sub-threshold technologies are considered to be the most energy-efficient solution for low power applications where area and performance is of secondary importance.

When operating in the Near-threshold or Sub-threshold region, transistors operate at a lower voltage and by such operation the transistor uses less power. When using this operation voltage range both, dynamic power and static power are reduced. Dynamic power is a ratio of the operating voltage by a power of two, and static power is a ratio of the operating voltage, therefore reducing the operating voltage of the device to a Sub-threshold voltage level will reduce the consumed power dramatically.

Therefor there is a need for technology that can operate the transistor at the Near-threshold or Sub-threshold voltage domains and still be reliable and give good performance.

DESCRIPTION OF THE INVENTION

When the chip logic cells operate in the Near-threshold or Sub-threshold region, the transistor uses less power. During this operation, the use of both dynamic and static power is reduced. Dynamic power is a ratio of the operating voltage by a power of two and static power is a ratio of the operating voltage, therefore reducing the operating voltage of the device to the Near-threshold or Sub-threshold voltage domains will reduce the consumed power dramatically.

One of the major limiting factors for using Near-threshold or Sub-threshold technology is the very low performance of the transistors at this low voltage, and due to this limitation the usage of Near-threshold or Sub-threshold technology in commercial chips is very limited.

One of the limiting factors that cause the slow speed at Near-threshold or Sub-threshold technologies is the limited drive stretch of the cell, which causes the cell to drive on his output less cells per a giving slew (Fan-out). A typical cell has dramatically smaller Fan-out at lower voltage than using higher voltage. This means that when building a "clock tree" to distribute evenly the clock between the different Flip-Flops (FF's) of a design, the amount of buffers needed to build this "tree" for a giving slew at the Near-threshold or Sub-threshold domain is higher. Because the "clock tree" is active all the time, the increase of the "clock tree" number of buffers causes consumption of much higher dynamic and static energy.

For one embodiment of the invention, a Near-threshold or Sub-threshold technology flow implementation is provided that optimizes the operating voltage of the chip including the "clock tree" implementation to achieve a large reduction of the power consumption while still maintaining good slew on the clock for all the design FF's.

Because the "Clock tree" is toggling all the time and consumes a big part of the chip power, there is a need to optimize the number of buffers used inside the "clock tree" while still keeping the required max slew on the "clock tree" buffers.

While operating the "clock tree" buffers at the Near-threshold or Sub-threshold voltage domain their slew become larger and their Fan-out is limited. So there is a tradeoff between the number of buffers which needs to be used for a giving max slew and the total power consumption of the "clock tree".

Another, embodiment of the invention is a way to use a slightly higher voltage for the clock buffer than the one which is being used by the other logic and FF's at the design and by this archiving improve driving strength for the "clock tree" buffers and better Fan-out. This caused by reducing dramatically the number of the buffers inside the "clock tree", and by this reducing the overall power of the "clock tree" even when working at slightly higher voltage.

Another, embodiment of the invention includes implementation of a Place and Route (P&R) block which includes 2 separate voltage domains one for the "clock tree" buffers and the second to the other logic cells and FF's at the block. The voltage that is used for the "clock tree" buffers is slightly higher than the voltage which is used for the other cells. This small difference is limited to the amount where the signal can move between two cells that operate at different voltages without the need of a level shifter.

Additionally, another embodiment of the invention may also include a method for selecting optimal voltage levels to be used by the "clock tree" buffers for a given number of FlipFlop's (FF's) in the design in order to achieve the optimal number of buffers at the "clock tree" which will optimize both the dynamic and static power.

BRIEF DESCRIPTION OF THE DRAWINGS

The invention may be understood by referring to the following description and accompanying drawings that are used to illustrate embodiments of the invention. In the drawings:

FIG. 1 illustrates an exemplary "clock tree" implementation which includes clock buffers operate at a higher voltage (VDD1), a clock qualifier which also operates at the higher voltage (VDD1) and FF's which operates at the lower supply (VDD2) in accordance with this invention;

FIG. 2 illustrates a place and route structure implementing multiple voltage domains in accordance with this invention;

DETAILED DESCRIPTION

Any ASIC design includes a large number of FF's which can range in the order of few tens of thousands or even few hundreds of thousands. All these FF's need, to sample using the same clock and this means that the clock needs to be distributed evenly between all these FF's to reduce the clock skew between each 2 FF's in the design.

The common method today of doing this even clock distribution on the ASIC with large amount of FF's is using a "clock tree" which means to build a "tree" of buffers that drive the clock signal from the clock source until the clock input pin of each FF's or memory. Each buffer can drive only an order of tens of FF's and then another buffer at the second level drives an order of tens of buffers from the first level and so on until the last buffer that is connected to the source of the clock which is also the root of the "tree".

In order to make sure that the skew between the different "leaves" of the "tree" will be small, there is a need that each "clock tree" buffer will have, a fast enough slop which means that the output capacitance that each buffer can drive is limited, what limits also the Fan-out of each buffer (the number of cells that a single cell can drive per a giving slew).

Building a "clock tree" at the Near-threshold or Sub-threshold domain add another complexity to the "tree" balancing requirement because the buffers are weak and their slew is large. Due to this fact the buffer Fan-out is very small which cause the total number of the buffers at the "clock tree" to increase.

Because the clock has very high activity (100%) the power consumption on the "clock tree" is a major part of the total power consumption of the ASIC and if the number of buffers increase by a large factor using Near-threshold or Sub-threshold voltage operation then there is a large increase on the "clock tree" power consumption which can be even larger than the saving done by doing this "clock tree" at lower voltage.

The proposed invention is a flow to design a Near-threshold or Sub-threshold ASIC solution using an optimal power "clock tree" which is implemented within a higher voltage level than the other cells of the block inside a single P&R.

Using a slightly higher operating voltage (less than 100 mv) for the "clock tree" relating to the operating voltage that the logic is using, will increase the power consumption of the "tree" by the square of the voltage difference, but will reduce the total number of buffers inside the "tree" by a large factor and by this reduce the overall power consumption on the "clock tree".

For an example, but not limited to, assuming we have 50,000 FF's inside the ASIC and the block is working at the Sub-threshold voltage of 0.5 v. Assuming that at this voltage in order to get a good slew on the clock the Fan-out of each buffer is limited to only 10 cells then we will need to use a total of 5,000 buffers for the first level, 500 buffers for the second level, 50 buffers for the $3^{rd}$, 5 for the $4^{th}$ and 1 for the root of the tree. From this we can get a total of 5556 buffers at the "tree", which are toggle at 100% when the clock is active. If we use a slightly higher voltage to the "clock tree" only but with a small gap that won't require a level shifter between the logic and the "clock tree" buffers for example 0.6 v the buffer will be able to drive about 20 cells for the same target clock slew. Taking this new Fan-out of 20, we get the following "clock tree" structure: 2500 buffers for the first level, 125 for the second level, 7 for the $3^{rd}$ level and 1 for the root of the "tree". We have now a total number of 2633 buffers which is 47% of the previous option, this means we saved 53% of the "clock tree" buffers and also active and leakage power. On the opposite, by increasing the "clock tree" voltage by only 0.1 v the power will increase by 30% so the total saving doing this scheme is 23% from the total "clock tree" power.

This invention is defining a new novel design flow to build a "clock tree" which uses a slightly higher voltage than the voltage which is used by the logic, and doesn't require a level shifter for the Near-threshold and Sub-threshold domains. This unique flow and method reduces the amount of buffers used by the "clock tree" and by this save large amount of "clock tree" power consumption and still maintaining the clock minimal slew and the FF's required skew.

In the following description, numerous specific details are set forth. However, it is understood that embodiments of the invention may be practiced without these specific details. In other instances, well-known circuits, structures and techniques have not been shown in details in order not to obscure the understanding of this description.

FIG. 1 illustrates an exemplary "clock tree" implementation comprising of few clock buffer rows which drive all FF's at the design. The "clock tree" buffers are operating by the higher VDD1 zone (as seen at block 101) and the FF's are operating by the lower VDD2 zone like the other cells at the design (as seen at block 102) in accordance with this invention. The voltage difference between VDD1 and VDD2 is small enough so there are no requirements for a level shifter on the signals going from one domain to the other. As shown in FIG. 1, the "clock tree" is comprises from multiple clock buffer cells, shown for example as cells $104_1$-$104n$, At the leafs of the "tree", the last clock buffer drives a clock qualifier (cell 105) which is used to turn off the clock when it's not logically needed by the FF's. The clock qualifier output drives the FF's $103_1$-$103n$.

FIG. 2 illustrates a place and route structure 200 implementing 2 different voltage domains in accordance with this invention. As shown in FIG. 2, a Place and Route structure scheme 201 of the prior art includes one supply voltage designated Vdd. In accordance with this invention, place and route structure 200 includes two supply voltages shown as Vdd1 and Vdd2 implemented as a multi-supply mesh that provides multiple supply voltages for concurrent use. Place and route structure 200 implements as an example two supply voltages for concurrent use in a 3-to-1 ratio (i.e. three Vdd1 for every Vdd2). In accordance with various alternative embodiments of the invention, two supply voltages can be implemented in various desired ratios.

Each cell in the design has a different set of TAP's that can connect to the relevant supply, this means that the "clock tree" buffers and qualifiers has special TAP which connect to the VDD1 supply and the other FF's and logic cells at the design has a TAP which connected to the VDD supply.

According to this invention, the implementation of a "clock tree" for evenly clock distribution inside an ASIC is done. Furthermore, this ASIC is implemented in the Near-threshold or Sub-threshold voltage domain. The "clock tree" implementation is done using a slightly higher voltage than the one which is used for the other cells at the design and by this, increasing the driving capabilities of the "clock tree" buffers and its maximum Fan-out. By selecting the optimal voltage to be used for the "clock tree" buffers depending on the number of the FF's in the design a large reduction in the number of buffers inside the "clock tree" is achieved and by this reduce the "clock tree" total power consumption compared to the use of the lower voltage domain for all the block including the "clock tree" buffers.

Embodiments of the invention have been described as including various operations. Many of the processes are described in their most basic form, but operations can be added to or deleted from any of the processes without departing from the scope of the invention.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

What is claimed is:

1. An ASIC, comprising:
a plurality of logic cells operating in a near-threshold or sub-threshold voltage domain;
a clock tree comprising a plurality of transistors operating at a voltage range having a minimal value of zero and a maximal value at the near-threshold or sub-threshold voltage domain, wherein clock signals propagate in the clock tree and drive the clocks of flip flops located in the plurality of logic cells;
wherein a voltage domain in which the clock tree is operating is slightly higher than a voltage domain in which the plurality of logic cells are operating, wherein the clock tree further comprises buffers;
a voltage level of the clock tree buffers is defined in accordance with the number of flip flops within the ASIC.

2. The ASIC of claim 1, wherein the plurality of transistors operate in more than one voltage domain residing in a near-threshold or sub-threshold region.

3. The ASIC of claim 1, wherein the slightly higher voltage domain used by the clock tree is utilized to achieve better performance in the ASIC.

4. The ASIC of claim 3, wherein a voltage difference between the voltage domains omits a need to translate logic levels between the clock tree and the other component of the ASIC.

5. The ASIC of claim 1, wherein the clock tree resides in a dedicated Place and Route implementation.

6. The ASIC of claim 1, wherein other transistors outside the clock tree reside in the same dedicated Place and Route implementation.

7. The ASIC of claim 1, wherein the clock tree comprises fan-out outlines.

8. The ASIC of claim 7, wherein the voltage level of the clock tree buffers is determined according to the number of flip flops residing in a fan-out fashion.

9. The ASIC of claim 8, wherein the voltage level of the clock tree buffers is selected based on the number of flip flops in a block and the required fan-out of the clock tree buffers.

10. The ASIC of claim 9, wherein the voltage level of the clock tree buffers is selected in order to optimize the total number of buffers at the clock tree and this also optimize the power consumption.

11. The ASIC of claim 7, further comprises components that use the clock tree to evenly distribute the clock signals between the components inside the ASIC.

12. An ASIC, comprising:
a plurality of logic cells operating in a near-threshold or sub-threshold voltage domain;
a clock tree comprising a plurality of transistors operating at a voltage range having a minimal value of zero and a maximal value at the near-threshold or sub-threshold voltage domain, wherein clock signals propagate in the clock tree and drive the clock of flip flops located in the plurality of logic cells;
wherein the voltage domain in which the clock tree is operating is slightly higher than a voltage domain in which the plurality of logic cells are operating;
wherein the clock tree comprises fan-out outlines;
and buffers, and wherein a voltage level of the clock tree buffers is determined according to the number of flip flops residing in a fan-out fashion.

13. The ASIC of claim 12, wherein the plurality of transistors operate in more than one voltage domain residing in a near-threshold or sub-threshold region.

14. The ASIC of claim 12, wherein the slightly higher voltage domain used by the clock tree is utilized to achieve better performance in the ASIC.

15. The ASIC of claim 14, wherein a voltage difference between the voltage domains omits a need to translate logic levels between the clock tree and the other component of the ASIC.

16. The ASIC of claim 12, wherein the clock tree resides in a dedicated Place and Route implementation.

17. The ASIC of claim 12, wherein other transistors outside the clock tree reside in the same dedicated Place and Route implementation.

18. The ASIC of claim 12, wherein the voltage level of the clock tree buffers is selected based on the number of flip flops in a block and the required fan-out of the clock tree buffers.

19. The ASIC of claim 18, wherein the voltage level of the clock tree buffers is selected in order to optimize the total number of buffers at the clock tree and this also optimize a power consumption.

20. The ASIC of claim 12, further comprises components that use the clock tree to evenly distribute the clock signals between the components inside the ASIC.

* * * * *